United States Patent
Vohra et al.

(10) Patent No.: US 7,919,222 B2
(45) Date of Patent: *Apr. 5, 2011

(54) COATING COMPOSITIONS FOR USE WITH AN OVERCOATED PHOTORESIST

(75) Inventors: Vaishali Raghu Vohra, South Grafton, MA (US); James W. Thackeray, Braintree, MA (US); Gerald B. Wayton, Leicester, MA (US)

(73) Assignee: Rohm and Haas Electronics Materials LLC, Marlborough, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/698,397

(22) Filed: Jan. 26, 2007

(65) Prior Publication Data

US 2007/0178406 A1 Aug. 2, 2007

Related U.S. Application Data

(60) Provisional application No. 60/763,266, filed on Jan. 29, 2006.

(51) Int. Cl.
*G03C 1/76* (2006.01)
*G03C 1/492* (2006.01)

(52) U.S. Cl. .......... 430/270.1; 430/271.1; 430/325
(58) Field of Classification Search .......... 430/270.1, 430/271.1, 325
See application file for complete search history.

(56) References Cited

U.S. PATENT DOCUMENTS 7,585,612 B2 * 9/2009 Thackeray et al. ...... 430/271.1
* cited by examiner

*Primary Examiner* — Geraldina Visconti
(74) *Attorney, Agent, or Firm* — Peter F. Corless; Darryl P. Frickey; Edwards Angell Palmer & Dodge LLP

(57) ABSTRACT

Underlying coating compositions are provided for use with an overcoated photoresist composition. In one aspect, the coating composition can be crosslinked and comprise one or more components that contain one or more acid-labile groups and/or one or more base-reactive groups that are reactive following crosslinking. In another aspect, underlying coating composition are provided that can be treated to provide a modulated water contact angle. Preferred underlying coating compositions can exhibit enhanced etch rates in plasma etchants. Additional preferred coating compositions can enhance lithographic performance of an associated photoresist composition.

6 Claims, No Drawings

COATING COMPOSITIONS FOR USE WITH AN OVERCOATED PHOTORESIST

The present application claims the benefit of U.S. provisional application 60/763,266 filed Jan. 29, 2006

The invention relates to compositions (particularly antireflective coating compositions or "ARCs") for use with an overcoated photoresist composition. In one aspect, the coating compositions can be crosslinked and comprise one or more components that contain one or more acid-labile groups and/or one or more base-reactive groups that are reactive following crosslinking. In another aspect, underlying coating compositions are provided that can be treated to provide a modulated water contact angle. In a yet further aspect, coat compositions of the invention that can exhibit enhanced etch rates in plasma etchants.

Photoresists are photosensitive films used for the transfer of images to a substrate. A coating layer of a photoresist is formed on a substrate and the photoresist layer is then exposed through a photomask to a source of activating radiation. The photomask has areas that are opaque to activating radiation and other areas that are transparent to activating radiation. Exposure to activating radiation provides a photo-induced or chemical transformation of the photoresist coating to thereby transfer the pattern of the photomask to the photoresist-coated substrate. Following exposure, the photoresist is developed to provide a relief image that permits selective processing of a substrate.

A major use of photoresists is in semiconductor manufacture where an object is to convert a highly polished semiconductor slice, such as silicon or gallium arsenide, into a complex matrix of electron conducting paths that perform circuit functions. Proper photoresist processing is a key to attaining this object. While there is a strong interdependency among the various photoresist processing steps, exposure is believed to be one of the most important steps in attaining high resolution photoresist images.

Reflection of activating radiation used to expose a photoresist often poses limits on resolution of the image patterned in the photoresist layer. Reflection of radiation from the substrate/photoresist interface can produce spatial variations in the radiation intensity in the photoresist, resulting in non-uniform photoresist linewidth upon development. Radiation also can scatter from the substrate/photoresist interface into regions of the photoresist where exposure is non-intended, again resulting in linewidth variations.

One approach used to reduce the problem of reflected radiation has been the use of a radiation absorbing layer interposed between the substrate surface and the photoresist coating layer.

Electronic device manufacturers continually seek increased resolution of a photoresist image patterned over antireflective coating layers.

In particular, ARC etch rates can be problematic. During plasma etching of an underlying ARC layer to thereby bare a substrate (e.g. microelectronic wafer) surface, the plasma etch also will remove the overlying developed photoresist mask. After the ARC removal is complete, an effective thickness of the resist mask must remain to function during processing of the bared substrate surface. However, as the time period required to remove the ARC layer increases, the extent of degradation also undesirably increases. See U.S. Patent Publication 2002/0028408.

Developed photoresist mask degradation should be minimized to permit for many applications use of as thin a photoresist layer as possible. Thinner photoresist layers are often desired to provide maximum resolution of a patterned image. If undeveloped film thickness loss (UFTL) is significant during ARC etching, then a thicker resist layer must be applied so that a resist mask of an effective thickness remains at the end of the etching process.

We now provide new organic coating compositions that can exhibit increased etch rates in plasma etchants. Particularly preferred compositions of the invention can provide such enhanced etches rates whereby undesired resist degradation can be minimized during etching.

Preferred underlying coating compositions of the invention may have an increased oxygen content. In one aspect, the oxygen content of the antireflective composition may be increased by addition of a high oxygen content additive. Such an additive preferably comprises at least about 5, 10, 20, 30, 40 or 50 mole percent oxygen based on the total additive composition, more preferably at least about 50 mole percent oxygen, still more preferably at least about 60 mole percent oxygen, based on the total of the additive composition. A preferred high oxygen content additive is a resin with oxygen substitution.

Preferred organic coating compositions of the invention also can provide a modulated (changed) water contact angle.

In a first preferred aspect, organic coating compositions of the invention may be treated to provide a decreased water contact angle. In such aspects, composition coating layer areas that are treated to provide a decreased water contact angle are rendered more hydrophilic.

In a further aspect, organic coating compositions of the invention may be treated to provide an increased water contact angle. In such aspects, composition coating layer areas that are treated to provide an increased water contact angle are rendered more hydrophobic.

Preferred coating compositions of the invention are crosslinked prior to treatment to modulate water contact angle. Such crosslinking includes hardening and covalent-bonding forming reactions between one or more composition components.

Preferably, such crosslinking of a coating composition of the invention should not result in reaction of acid-labile or base-reactive groups that are intended to react during subsequent lithographic processing of an overcoated photoresist layer. Thus, for example, if the coating composition is crosslinked in the presence of acid such as generated from a thermal acid generator, the acid-promoted crosslinking reaction should not significantly cause reaction of photoacid-labile groups of the coating composition.

Coating compositions of the invention may be treated by a variety of methods to modulate the water contact angle of composition coating layer areas. For instance, a coating composition layer may be treated with radiation such as sub-300 nm or sub-200 nm radiation, or thermally. Preferred treatments involve contacting a coating composition layer with acid and/or base to provide a modulated water contact angle of those composition coating layer areas that contact the acid or base.

Thus, for instance, in preferred aspect, a coating composition of the invention comprises one or more components that will be reactive to photoacid generated in an overcoated layer, particularly an overcoated photoresist composition layer.

The photogenerated acid can migrate to at least top portions of the underlying coating composition layer and react with one or more components in the underlying coating composition. For instance, the underlying composition coating layer may comprise one or more components that contain photoacid-labile groups such as esters or acetals that will react with the migrating photoacid particularly during post-exposure bake processing of the overcoated resist and thereby provide polar, more hydrophilic groups such as hydroxy or carboxylic acid which will decrease the water contact angle of the underlying composition coating layer. As discussed above, such a deprotection reaction suitably may occur at temperatures and conditions distinct than prior crosslinking of the underlying composition coating layer.

Preferably, upon treatment such as by acid or base, the eater contact angle of an applied composition coating layer will be modulated (increased or decreased) by at least 5, 10, 15, 20 or 30 percent.

In another preferred aspect, a coating composition of the invention may comprise one or more components that will be reactive to base such as an aqueous alkaline photoresist developer composition. The basic composition will contact at least top portions of the underlying coating composition layer and react with one or more components in the underlying coating composition. For instance, the underlying composition coating layer may comprise one or more components that contain anhydride groups that ring-open in the presence of base such as aqueous alkaline photoresist developer composition to thereby provide carboxylic acid moieties which will decrease the water contact angle of the underlying composition coating layer.

In another aspect, a coating composition of the invention may comprise one or more components that will be reactive to photoacid generated in an overcoated layer particularly an overcoated photoresist composition layer. In this aspect, reaction with the photogenerated acid increases the water contact angle of the underlying composition coating layer. For instance, the photoacid-generated acid may induce or otherwise result in crosslinking or more extensive crosslinking of one or more components of the underlying coating composition, which can increase the water contact angle of that composition coating layer.

As indicated above, antireflective compositions of the invention also preferably contain a component that comprises chromophore groups that can absorb undesired radiation used to expose the overcoated resist layer from reflecting back into the resist layer. Such chromophore groups may be present with other composition components such as the resin(s) or an acid generator compound, or the composition may comprise another component that may comprise such chromophore units, e.g. a small molecule (e.g. MW less than about 1000 or 500) that contains one or more chromophore moieties, such as one or more optionally substituted phenyl, optionally substituted anthracene or optionally substituted naphthyl groups.

Generally preferred chromophores for inclusion in coating composition of the invention particularly those used for antireflective applications include both single ring and multiple ring aromatic groups such as optionally substituted phenyl, optionally substituted naphthyl, optionally substituted anthracenyl, optionally substituted phenanthracenyl, optionally substituted quinolinyl, and the like. Particularly preferred chromophores may vary with the radiation employed to expose an overcoated resist layer. More specifically, for exposure of an overcoated resist at 248 nm, optionally substituted anthracene and optionally substituted naphthyl are preferred chromophores of the antireflective composition. For exposure of an overcoated resist at 193 nm, optionally substituted phenyl and optionally substituted naphthyl are particularly preferred chromophores of the antireflective composition. Preferably, such chromophore groups are linked (e.g. pendant groups) to a resin component of the antireflective composition.

As discussed above, coating compositions of the invention preferably are crosslinking compositions and contain a material that will crosslink or otherwise cure upon e.g. thermal or activating radiation treatment. Typically, the composition will contain a crosslinker component, e.g. an amine-containing material such as a melamine, glycouril or benzoguanamine compound or resin.

Preferably, crosslinking compositions of the invention can be cured through thermal treatment of the composition coating layer. Suitably, the coating composition also contains an acid or more preferably an acid generator compound, particularly a thermal acid generator compound, to facilitate the crosslinking reaction.

For use as an antireflective coating composition, as well as other applications such as via-fill, preferably the composition is crosslinked prior to applying a photoresist composition layer over the composition layer.

Coating compositions of the invention are typically formulated and applied to a substrate as an organic solvent solution, suitably by spin-coating (i.e. a spin-on composition).

A variety of photoresists may be used in combination (i.e. overcoated) with a coating composition of the invention. Preferred photoresists for use with the antireflective compositions of the invention are chemically-amplified resists, especially positive-acting photoresists that contain one or more photoacid generator compounds and a resin component that contains units that undergo a deblocking or cleavage reaction in the presence of photogenerated acid, such as photoacid-labile ester, acetal, ketal or ether units. Negative-acting photoresists also can be employed with coating compositions of the invention, such as resists that crosslink (i.e. cure or harden) upon exposure to activating radiation. Preferred photoresists for use with a coating composition of the invention may be imaged with relatively short-wavelength radiation, e.g. radiation having a wavelength of less than 300 nm or less than 260 nm such as 248 nm, or radiation having a wavelength of less than about 200 nm such as 193 nm.

The invention further provides methods for forming a photoresist relief image and novel articles of manufacture comprising substrates (such as a microelectronic wafer substrate) coated with a coating composition of the invention alone or in combination with a photoresist composition.

As referred to herein, water contact angles of a coating composition of the invention may be determined by applying a composition layer such as by spin-coating onto a substrate such as a microelectronic wafer substrate. Spin-speeds can be varied as necessary to obtain film thickness in the range of 40-120 nm. The applied composition layer then may be thermally treated (e.g., 180° C. for 60 seconds on a proximity hotplate) such as to remove casting solvent and to crosslink or otherwise harden the coating layer. Contact angle measurements of the thus treated coating composition layer may be determined such as by use of a commercially available device such as those devices produced by Kruss GmbH of Hamburg Germany, including the JDSA-100 Dynamic Contact Angle Goniometer.

Other aspects of the invention are disclosed infra.

We now provide new organic coating compositions that are particularly useful with an overcoated photoresist layer. Preferred coating compositions of the invention may be applied by spin-coating (spin-on compositions) and formulated as a solvent composition. The coating compositions of the invention are especially useful as antireflective compositions for an overcoated photoresist and/or as planarizing or via-fill compositions for an overcoated photoresist composition coating layer.

As discussed above, preferred coating compositions of the invention also can provide an increased or decreased water contact angle.

Preferred coating compositions of the invention also can exhibit enhanced etch rates in plasma etchants.

Thus, in one aspect, coating compositions are provided that can be treated to provide a different water contact angle. Suitably, the water contact angle can be changed by treatment with acid or base. The coating composition preferably comprises one or more oxygen-containing components. The coating composition also preferably comprises one or more components that comprise acid-labile groups and/or base reactive groups.

In certain preferred underlying coating compositions of the invention, the coating composition may comprise: 1) a first component that can provide a different water contact angle upon treatment, e.g. a component that comprises acid-labile or base-reactive groups; and 2) a second component distinct (i.e. not covalently linked) from the first component and that can provide an enhanced plasma etch e.g. with respect to an oxygen-based plasma etchant and relative to an otherwise comparable composition that does not contain the second component 2). The coating composition also may suitably comprises one or more additional components distinct (i.e. not covalently linked) from 1) and 2) such as a crosslinker component. For use as an antireflective layer, one or more of the first component 1), second component 2) or other composition components may contain one or more chromophore groups, particularly aromatic groups such as optionally-substituted phenyl, optionally substituted naphthyl, or optionally substituted anthracene. Preferably, distinct first component 1) and second component 2) are each resins.

In other aspects of the invention, underlying coating compositions of the invention comprises a single component (e.g. resin) that can impart both water contact angle modulation and etch rate enhancement properties. For example, a coating composition may comprise a resin that has a high oxygen content and that comprises acid-labile and/or base reactive groups.

We have found that preferred underlying coating compositions can provide reduced defects in a processed substrate, particularly reduced deposition of organic residues in substrates areas that are intended to be bared of photoresist. Additionally, use of preferred underlying coating compositions can reduce or minimize the occurrence of undesired pattern collapse of a photoresist relief image formed over the underlying layer.

Without being bound by any theory, it is believed that by modulating the water contact angle of the underlying composition coating layer, at least in top portions of the underlying coating composition coating layer, the underlying layer can be removed more effectively by photoresist developer solutions. Thereby, undesired organic residues will be less prone to remain in substrate areas intended to be bared following development.

Also without being bound by any theory, it is believed that preferred underlying coating compositions of the invention can provide more effective adherence to an overcoated photoresist relief image and thereby enable reduced occurrence of undesired pattern collapse of resist relief images.

Coating Compositions:

Oxygen Content

Preferred underlying coating compositions preferably have a relatively increased oxygen content. Preferred coating compositions of the invention comprise at least about 1, 2, 3, 5, 10, 15, 20 or 25 weight percent oxygen based on total weight of all solids of the coating composition. As referred to herein, all solids of a coating composition are all materials of the composition except for solvent carrier. Such an increased oxygen content can be achieved by a variety of ways.

In a first preferred aspect of the invention, the oxygen content of the antireflective composition may be increased by addition of a high oxygen content additive. Such an additive preferably comprises at least about 5, 10, 20, 30 or 40 mole percent oxygen based on the total additive component.

Rather than or in addition to employing a separate high oxygen content additive, composition resin and/or crosslinker components may be adapted to provide a high oxygen content composition.

For example, underlying coating compositions of the invention used for antireflective purposes typically contain a chromophore that absorbs exposure radiation. Preferably, such chromophores are bound covalently to a resin component of the coating composition. The chromophore may be adapted to have a high oxygen content. In that way, the oxygen content of the antireflective composition can be increased by virtue of a particular monomer or polymer employed as the resin. For instance, for underlying coating compositions of the invention that are used with resists imaged at 193 nm, a preferred chromophore is phenyl. For underlying coating compositions of the invention that are used with resists imaged at 248 nm, a preferred chromophore is anthracene. Other suitable chromophores, especially for 248 nm imaging, include quinolinyl, and ring-substituted quinolinyl derivatives such as hydroxyquinolinyl groups. Such phenyl, anthracene and other aromatic chromophores can have one or more high oxygen content substituents, such as an ester linkage, particularly a high oxygen content ester such as acetoxy (i.e. —OC(=O)CH$_3$. Some specifically preferred high oxygen content chromophores that can be polymerized to provide a resin for use in an underlying coating composition of the invention include of acetoxystyrene, 2-hydroxy-3-phenoxymethacrylate, 2-phenoxyethylmethacrylate; hydroxy anthracene; and acetoxyanthracene.

A resin for use in a coating composition may be adapted to have a high oxygen content separate from modification of the chromophore groups. For example, resins for use in a coating composition of the invention may be produced by polymerization of one or more high oxygen content monomers. For at least certain applications, preferred resins for use in underlying coating compositions contain polymerized acrylate ester units, wherein the linked ester moiety (i.e. group linked to carboxyl oxygen of ester) contains one or more oxygen atoms.

In certain aspects, preferred underlying coating composition resins contain polymerized acrylate ester units, wherein the ester moiety linked to the carboxyl oxygen contains one or more oxygen atoms. For purposes of illustration, the ester moiety linked to the carboxyl oxygen of an ester moiety is the group R of the following formulae wherein the carboxyl oxygen is underlined: —C(=O)OR.

In a more particular aspect, suitable compounds for incorporation into a resin for use in an underlying coating composition of the invention are monomers of the following formula:

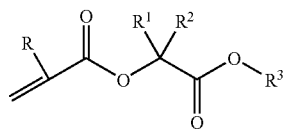

wherein R is hydrogen or alkyl having 1 to about 8 carbons, and preferably R is hydrogen or methyl; and R$^1$, R$^2$ and R$^3$ are each independently optionally substituted alkyl preferably having from 1 to about 10 carbon atoms, more preferably 1 to about 3 or 4 carbon atoms; or optionally substituted alkoxy having 1 to about 10 carbon atoms, more preferably 1 to about 3 or 4 carbon atoms. Particularly preferred $R^1$, $R^2$ and $R^3$ groups have one or two carbon atoms, i.e. optionally substituted methyl, ethyl, methoxy and ethoxy. Preferred substituents of substituted $R^1$, $R^2$ and $R^3$ groups are oxygen-containing moieties, e.g. hydroxyl; lower alkoxy such as $C_{1-4}$alkoxy i.e. methoxy, ethoxy, propoxy, butoxy; lower alkyl esters such as —C(=O)OC$_{1-4}$H$_{3-9}$; and alkanoyl such as acetyl (—C(=O)CH$_3$) or aldehyde (C(=O)H). Other suitable substituents of substituted $R^1$, $R^2$ and $R^3$ groups include halo (F, Cl, Br, I), $C_{1-4}$ alkyl, $C_{2-4}$ alkenyl and the like.

Additional specifically preferred monomers to include in high oxygen content polymers or other additives of the invention include the following: for coating compositions used with resists imaged at 248 nm, preferred monomers include e.g. ethylene glycol methyl ether methacrylate (EGMA), diethylene glycol-methylether methacrylate (DEGMA), and 2,3-dihydroxypropylmethacrylate (DHPMA), which preferably will be polymerized with one or more monomers that contain an anthracene moiety; and for coating compositions used with resists imaged at 193 nm, preferred monomers include e.g. 3-methoxy-4-acetoxystyrene, 4-nitrostyrene, 3-nitrostyrene, and 4-nitrophenylmethacrylate.

Resins used in coating compositions of the invention also include those that contain one or more heteroalicyclic rings which may be suitably fused to a resin backbone. Such a fused heterocyclic ring units suitably contain one or more oxygen and/or sulfur atoms, and preferably one or more oxygen atoms. By stating herein that a cyclic group is fused to a polymer backbone, it is meant that two ring members of the cyclic group, typically two adjacent carbon atoms of the cyclic group, are also part of the polymer backbone. Such a fused ring can be provided by polymerizing a cyclic monomer that has an endocyclic double bond.

The oxygen and/or sulfur atoms of the heteroalicyclic ring are preferably direct ring members (bi-radical linkages), rather than e.g. a multiple bond group such as a keto or thioketo ring member, although such keto groups also may be present. Also, less preferred are groups that contain any such saturated groups such as a ketone or other carbonyl including ester, lactone, anhydride, etc. In certain aspects, resins that contain anhydride groups will be less preferred and excluded.

Preferred oxygen ring polymer units will be free of other hetero atoms such as sulfur (i.e. only oxygen and carbon ring members). Typically, the oxygen ring unit will contain a single oxygen ring atom and may have one or more ring substituents.

Additionally, an oxygen heteroalicyclic group may be suitably present in a polymer together with polymerized carbon alicyclic compounds such as optionally substituted norbornene, or with other groups such as acrylate groups. As referred to herein, the term "carbon alicyclic group" means each ring member of the non-aromatic group is carbon. The carbon alicyclic group can have one or more endocyclic carbon-carbon double bonds, provided the ring is not aromatic.

Some suitable vinyl (endocyclic double bond) heterocyclic monomers that can be polymerized to provide resins useful in coating compositions of the invention include the following.

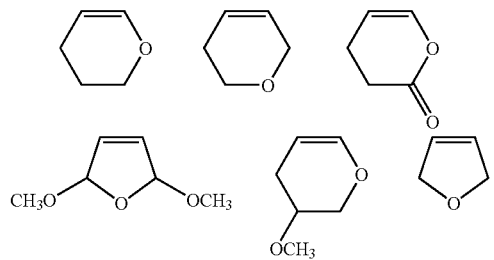

Dihydropyran (DHP) can be a particularly preferred monomer to react and incorporate into a resin utilized in an underlying coating composition of the invention.

Suitable resins utilized in underlying coating compositions of the invention will have a weight average molecular weight (Mw) of about 800 or 1,000 to about 100,000, more preferably about 2,000 to about 30,000, still more preferably from about 2,000 to 15,000 or 20,000, with a molecular weight distribution (Mw/Mn) of about 3 or less, more preferably a molecular weight distribution of about 2 or less. Molecular weights (either Mw or Mn) of the polymers of the invention are suitably determined by gel permeation chromatography.

Modulated Water Contact Angle

As discussed above, coating compositions are provided that can be treated to provide a different water contact angle, e.g. where the water contact angle is changed by treatment with acid or base.

As discussed above, a coating composition may suitably comprise photoacid-labile groups or base-reactive groups such as anhydride groups which can react with acid or base respectively to provide a decreased water contact angle in those coating layer regions where acid or base contacts the coating layer.

Suitable photoacid-labile groups for use in an underlying coating composition include those discussed below for use in chemically-amplified positive photoresists. Generally preferred is to employ a resin component that contains one or more polymerized units that contain photoacid-labile groups such as pendant photoacid-labile esters (e.g. tert-butyl esters) or acetal groups. Also preferred is use of a component such ass a resin that contains one or more base-reactive groups, e.g. groups that can become more hydrophilic upon exposure to photoresist aqueous alkaline developer solutions. Preferred base-reactive groups include anhydride groups that can ring-open in the presence of suitable base to provide hydrophilic moieties. Exemplary suitable base-reactive anhydride groups include polymerized units of itaconic anhydride, citraconic anhydride, maleic anhydride, 3-methylene-dihydro-pyran-2,6-dione, 4-methylene-dihydro-pyran-2,6-dione, and 3H-pyran-2,6-dione. Such base-reactive groups may be polymerized units of a resin component of an underlying coating composition.

For antireflective applications, the resin component also may suitably comprise one or more chromophore groups which as discussed suitably may be optionally substituted carbocyclic aryl groups such as optionally substituted anthracene, optionally substituted naphthyl or optionally substituted phenyl groups. Preferred resins for use in underlying coating compositions are copolymers (includes terpolymers and other higher order polymers) that comprise 1) photoacid-labile groups and/or base-reactive groups such as anhydride groups and 2) chromophore groups. See the examples which follow for exemplary preferred copolymers for use in the present underlying coating compositions.

One or more resins of resin component of an underlying coating composition may have a variety of backbone structures. For example, suitable resins include polyesters, polyacrylates, polysulfones, polyamides, poly(vinylalcohols), and the like. Particularly preferred are resin components that comprise one or more polyester resins and/or one or more poly(acrylate) resins. Polyesters may be provided by polymerization of a carboxy-containing compound (such as a carboxylic acid, ester, anhydride, etc.) and a hydroxy-containing compound, preferably a compound having multiple hydroxy groups such as a glycol, e.g. ethylene glycol or propylene glycol, or glycerol, or other diols, triols, tetraols and the like. It will be understood that in such polyester resins at least certain of the ester groups are not photoacid-labile, i.e. the ester repeat units do not undergo deblocking or other cleavage during typical lithographic processing of pre-exposure bake, exposure to activating radiation, post-exposure heating, and/or development, although the polyester resin also may include photoacid-labile ester groups. Preferably, ester repeat units are present in the polymer backbone, i.e. the ester groups (—(C=O)O—) are present on the branched or substantially linear chain that forms the polymer length. Also preferred is that such ester groups contain aromatic substitution, e.g. a phenyl, naphthyl or anthracene group, such as may be provided by reaction of a an alkyl phthalate with a polyol.

Such polyester resins are suitably prepared by charging a reaction vessel with the a polyol, a carboxylate compound, and other compounds to be incorporated into the formed resin, an acid such as a sulfonic acid, e.g. methane sulfonic acid or para-toluene sulfonic acid, and the like. The reaction mixture is suitably stirred at an elevated temperature, e.g. at least about 80° C., more typically at least about 100° C., 110° C., 120° C., 130° C., 140° C., or 150° C. for a time sufficient for polymer formation, e.g. at least about 2, 3, 4, 5, 6, 8, 12, 16, 20, 24 hours. Exemplary preferred conditions for synthesis of useful resins are detailed in the examples which follow.

Acrylate-based resins also are preferred materials to use in underlying coating compositions of the invention. Such resins can be prepared by known methods, such as polymerization (e.g. in the presence of a radical initiator) of one or more acrylate monomers such as e.g. hydroxyethylmethylacrylate, hydroxyethylacrylate, methylmethacrylate, butyl methacrylatemethylanthracene methacrylate or other anthracene acrylate and the like. See U.S. Pat. No. 5,886,102 assigned to the Shipley Company for exemplary suitable polymers. See also the examples which follow for suitable acrylate resins and syntheses thereof.

As discussed, for antireflective applications, suitably one or more of the compounds reacted to form the resin comprise a moiety that can function as a chromophore to absorb radiation employed to expose an overcoated photoresist coating layer. For example, a phthalate compound (e.g. a phthalic acid or dialkyl phthalate (i.e. di-ester such as each ester having 1-6 carbon atoms, preferably a di-methyl or ethyl phthalate) may be polymerized with an aromatic or non-aromatic polyol and optionally other reactive compounds to provide a polyester particularly useful in an antireflective composition employed with a photoresist imaged at sub-200 nm wavelengths such as 193 nm. Similarly, resins to be used in compositions with an overcoated photoresist imaged at sub-300 nm wavelengths or sub-200 nm wavelengths such as 248 nm or 193 nm, a naphthyl compound may be polymerized, such as a naphthyl compound containing one or two or more carboxyl substituents e.g. dialkyl particularly di-$C_{1-6}$alkyl naphthalenedicarboxylate. Reactive anthracene compounds also are preferred, e.g. an anthracene compound having one or more carboxy or ester groups, such as one or more methyl ester or ethyl ester groups.

The compound that contains a chromophore unit also may contain one or preferably two or more hydroxy groups and be reacted with a carboxyl-containing compound. For example, a phenyl compound or anthracene compound having one, two or more hydroxyl groups may be reacted with a carboxyl-containing compound.

Additionally, underlying coating composition that are employed for antireflective purposes may contain a material that contains chromophore units that is separate from a resin component that provides water contact angle modulation (e.g. a resin that contains photoacid-labile groups and/or base-reactive groups. For instance, the coating composition may comprise a polymeric or non-polymeric compound that contain phenyl, anthracene, naphthyl, etc. units. It is often preferred, however, that the one or more resins that provide water contact angle modulation also chromophore moieties.

Preferably resins of underlying coating compositions of the invention will have a weight average molecular weight (Mw) of about 1,000 to about 10,000,000 daltons, more typically about 5,000 to about 1,000,000 daltons, and a number average molecular weight (Mn) of about 500 to about 1,000,000 daltons. Molecular weights (either Mw or Mn) of the polymers of the invention are suitably determined by gel permeation chromatography.

As mentioned, preferred underlying coating compositions of the invention can be crosslinked, e.g. by thermal and/or radiation treatment. For example, preferred underlying coating compositions of the invention may contain a separate crosslinker component that can crosslink with one ore more other components of the coating composition. Generally preferred crosslinking coating compositions comprise a separate crosslinker component. Particularly preferred coating compositions of the invention contain as separate components: a resin, a crosslinker, and an acid source such as a thermal acid generator compound. Thermal-induced crosslinking of the coating composition by activation of the thermal acid generator is generally preferred.

Suitable thermal acid generator compounds for use in a coating composition include ionic or substantially neutral thermal acid generators, e.g. an ammonium arenesulfonate salt, for catalyzing or promoting crosslinking during curing of an antireflective composition coating layer. Typically one or more thermal acid generators are present in an coating composition in a concentration from about 0.1 to 10 percent by weight of the total of the dry components of the composition (all components except solvent carrier), more preferably about 2 percent by weight of the total dry components.

Preferred crosslinking-type coating compositions of the invention also contain a crosslinker component. A variety of crosslinkers may be employed, including those crosslinkers disclosed in Shipley European Application 542008 incorporated herein by reference. For example, suitable coating composition crosslinkers include amine-based crosslinkers such as melamine materials, including melamine resins such as manufactured by Cytec Industries and sold under the tradename of Cymel 300, 301, 303, 350, 370, 380, 1116 and 1130. Glycolurils are particularly preferred including glycolurils available from Cytec Industries. Benzoquanamines and urea-based materials also will be suitable including resins such as the benzoquanamine resins available from Cytec Industries under the name Cymel 1123 and 1125, and urea resins available from Cytec Industries under the names of Powderlink 1174 and 1196. In addition to being commercially available, such amine-based resins may be prepared e.g. by the reaction of acrylamide or methacrylamide copolymers with formaldehyde in an alcohol-containing solution, or alternatively by the copolymerization of N-alkoxymethyl acrylamide or methacrylamide with other suitable monomers.

A crosslinker component of a coating composition of the invention in general is present in an amount of between about 5 and 50 weight percent of total solids (all components except solvent carrier) of the antireflective composition, more typically in an amount of about 7 to 25 weight percent total solids.

Coating compositions of the invention, particularly for reflection control applications, also may contain additional dye compounds that absorb radiation used to expose an overcoated photoresist layer. Other optional additives include surface leveling agents, for example, the leveling agent available under the tradename Silwet 7604 from Union Carbide, or the surfactant FC 171 or FC 431 available from the 3M Company.

To make a liquid coating composition of the invention, the components of the coating composition are dissolved in a suitable solvent such as, for example, one or more oxyisobutyric acid esters particularly methyl-2-hydroxyisobutyrate as discussed above, ethyl lactate or one or more of the glycol ethers such as 2-methoxyethyl ether (diglyme), ethylene glycol monomethyl ether, and propylene glycol monomethyl ether; solvents that have both ether and hydroxy moieties such as methoxy butanol, ethoxy butanol, methoxy propanol, and ethoxy propanol; methyl 2-hydroxyisobutyrate; esters such as methyl cellosolve acetate, ethyl cellosolve acetate, propylene glycol monomethyl ether acetate, dipropylene glycol monomethyl ether acetate and other solvents such as dibasic esters, propylene carbonate and gamma-butyro lactone. The concentration of the dry components in the solvent will depend on several factors such as the method of application. In general, the solids content of an underlying coating composition varies from about 0.5 to 20 weight percent of the total weight of the coating composition, preferably the solids content varies from about 2 to 10 weight of the coating composition.

Exemplary Photoresist Systems

A variety of photoresist compositions can be employed with coating compositions of the invention, including positive-acting and negative-acting photoacid-generating compositions. Photoresists used with antireflective compositions of the invention typically comprise a resin binder and a photoactive component, typically a photoacid generator compound. Preferably the photoresist resin binder has functional groups that impart alkaline aqueous developability to the imaged resist composition.

As discussed above, particularly preferred photoresists for use with underlying coating compositions of the invention are chemically-amplified resists, particularly positive-acting chemically-amplified resist compositions, where the photoactivated acid in the resist layer induces a deprotection-type reaction of one or more composition components to thereby provide solubility differentials between exposed and unexposed regions of the resist coating layer. A number of chemically-amplified resist compositions have been described, e.g., in U.S. Pat. Nos. 4,968,581; 4,883,740; 4,810,613; 4,491,628 and 5,492,793. Coating compositions of the invention are particularly suitably used with positive chemically-amplified photoresists that have acetal groups that undergo deblocking in the presence of a photoacid. Such acetal-based resists have been described in e.g. U.S. Pat. Nos. 5,929,176 and 6,090,526.

Underlying coating compositions of the invention also may be used with other positive resists, including those that contain resin binders that comprise polar functional groups such as hydroxyl or carboxylate and the resin binder is used in a resist composition in an amount sufficient to render the resist developable with an aqueous alkaline solution. Generally preferred resist resin binders are phenolic resins including phenol aldehyde condensates known in the art as novolak resins, homo and copolymers or alkenyl phenols and homo and copolymers of N-hydroxyphenyl-maleimides.

Preferred positive-acting photoresists for use with an underlying coating composition of the invention contains an imaging-effective amount of photoacid generator compounds and one or more resins that are selected from the group of:

1) a phenolic resin that contains acid-labile groups that can provide a chemically amplified positive resist particularly suitable for imaging at 248 nm. Particularly preferred resins of this class include: i) polymers that contain polymerized units of a vinyl phenol and an alkyl acrylate, where the polymerized alkyl acrylate units can undergo a deblocking reaction in the presence of photoacid. Exemplary alkyl acrylates that can undergo a photoacid-induced deblocking reaction include e.g. t-butyl acrylate, t-butyl methacrylate, methyladamantyl acrylate, methyl adamantyl methacrylate, and other non-cyclic alkyl and alicyclic acrylates that can undergo a photoacid-induced reaction, such as polymers in U.S. Pat. Nos. 6,042,997 and 5,492,793; ii) polymers that contain polymerized units of a vinyl phenol, an optionally substituted vinyl phenyl (e.g. styrene) that does not contain a hydroxy or carboxy ring substituent, and an alkyl acrylate such as those deblocking groups described with polymers i) above, such as polymers described in U.S. Pat. No. 6,042,997; and iii) polymers that contain repeat units that comprise an acetal or ketal moiety that will react with photoacid, and optionally aromatic repeat units such as phenyl or phenolic groups; such polymers have been described in U.S. Pat. Nos. 5,929,176 and 6,090,526.

2) a resin that is substantially or completely free of phenyl or other aromatic groups that can provide a chemically amplified positive resist particularly suitable for imaging at sub-200 nm wavelengths such as 193 nm. Particularly preferred resins of this class include: i) polymers that contain polymerized units of a non-aromatic cyclic olefin (endocyclic double bond) such as an optionally substituted norbornene, such as polymers described in U.S. Pat. Nos. 5,843,624, and 6,048,664; ii) polymers that contain alkyl acrylate units such as e.g. t-butyl acrylate, t-butyl methacrylate, methyladamantyl acrylate, methyl adamantyl methacrylate, and other non-cyclic alkyl and alicyclic acrylates; such polymers have been described in U.S. Pat. No. 6,057,083; European Published Applications EP01008913A1 and EP00930542A1; and U.S. pending patent application Ser. No. 09/143,462; iii) polymers that contain polymerized anhydride units, particularly polymerized maleic anhydride and/or itaconic anhydride units, such as disclosed in European Published Application EP01008913A1 and U.S. Pat. No. 6,048,662.

3) a resin that contains repeat units that contain a hetero atom, particularly oxygen and/or sulfur (but other than an anhydride, i.e. the unit does not contain a keto ring atom), and preferable are substantially or completely free of any aromatic units. Preferably, the heteroalicyclic unit is fused to the resin backbone, and further preferred is where the resin comprises a fused carbon alicyclic unit such as provided by polymerization of a norborene group and/or an anhydride unit such as provided by polymerization of a maleic anhydride or itaconic anhydride. Such resins are disclosed in PCT/US01/14914 and U.S. application Ser. No. 09/567,634.

4) a resin that contains fluorine substitution (fluoropolymer), e.g. as may be provided by polymerization of tetrafluoroethylene, a fluorinated aromatic group such as fluoro-styrene compound, and the like. Examples of such resins are disclosed e.g. in PCT/US99/21912.

Suitable photoacid generators to employ in a positive or negative acting photoresist overcoated over a coating composition of the invention include imidosulfonates such as compounds of the following formula:

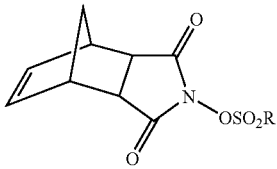

wherein R is camphor, adamantane, alkyl (e.g. $C_{1-12}$ alkyl) and perfluoroalkyl such as perfluoro($C_{1-12}$alkyl), particularly perfluorooctanesulfonate, perfluorononanesulfonate and the like. A specifically preferred PAG is N-[(perfluorooctanesulfonyl)oxy]-5-norbornene-2,3-dicarboximide.

Sulfonate compounds are also suitable PAGs for resists overcoated a coating composition of the invention, particularly sulfonate salts. Two suitable agents for 193 nm and 248 nm imaging are the following PAGS 1 and 2:

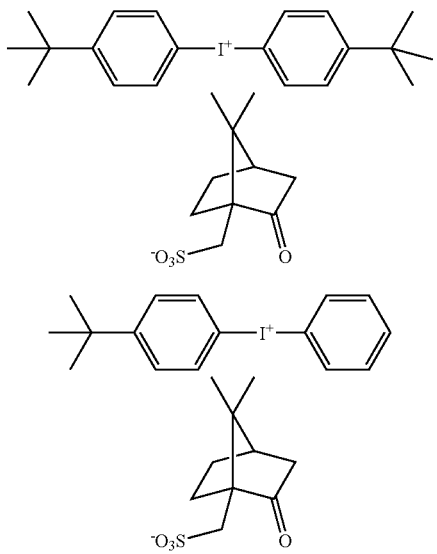

Such sulfonate compounds can be prepared as disclosed in European Patent Application 96118111.2 (publication number 0783136), which details the synthesis of above PAG 1.

Also suitable are the above two iodonium compounds complexed with anions other than the above-depicted camphorsulfonate groups. In particular, preferred anions include those of the formula $RSO_3$— where R is adamantane, alkyl (e.g. $C_{1-12}$ alkyl) and perfluoroalkyl such as perfluoro ($C_{1-12}$alkyl), particularly perfluorooctanesulfonate, perfluorobutanesulfonate and the like.

Other known PAGS also may be employed in photoresist used with underlaying coating compositions.

A preferred optional additive of photoresists overcoated a coating composition of the invention is an added base, particularly tetrabutylammonium hydroxide (TBAH), or tetrabutylammonium lactate, which can enhance resolution of a developed resist relief image. For resists imaged at 193 nm, a preferred added base is a hindered amine such as diazabicycloundecene or diazabicyclononene. The added base is suitably used in relatively small amounts, e.g. about 0.03 to 5 percent by weight relative to the total solids.

Preferred negative-acting resist compositions for use with an overcoated coating composition of the invention comprise a mixture of materials that will cure, crosslink or harden upon exposure to acid, and a photoacid generator.

Particularly preferred negative-acting resist compositions comprise a resin binder such as a phenolic resin, a crosslinker component and a photoactive component of the invention. Such compositions and the use thereof have been disclosed in European Patent Applications 0164248 and 0232972 and in U.S. Pat. No. 5,128,232 to Thackeray et al. Preferred phenolic resins for use as the resin binder component include novolaks and poly(vinylphenol)s such as those discussed above. Preferred crosslinkers include amine-based materials, including melamine, glycolurils, benzoguanamine-based materials and urea-based materials. Melamine-formaldehyde resins are generally most preferred. Such crosslinkers are commercially available, e.g. the melamine resins sold by Cytec Industries under the trade names Cymel 300, 301 and 303. Glycoluril resins are sold by Cytec Industries under trade names Cymel 1170, 1171, 1172, Powderlink 1174, and benzoguanamine resins are sold under the trade names of Cymel 1123 and 1125.

Lithographic Processing

In use, a coating composition of the invention is applied as a coating layer to a substrate by any of a variety of methods such as spin coating. The coating composition in general is applied on a substrate with a dried layer thickness of between about 0.02 and 0.5 μm, preferably a dried layer thickness of between about 0.04 and 0.20 μm. The substrate is suitably any substrate used in processes involving photoresists. For example, the substrate can be silicon, silicon dioxide or aluminum-aluminum oxide microelectronic wafers. Gallium arsenide, silicon carbide, ceramic, quartz or copper substrates may also be employed. Substrates for liquid crystal display or other flat panel display applications are also suitably employed, for example glass substrates, indium tin oxide coated substrates and the like. Substrates for optical and optical-electronic devices (e.g. waveguides) also can be employed.

Preferably the applied coating layer is cured before a photoresist composition is applied over the underlying coating composition. Cure conditions will vary with the components of the underlying coating composition. Particularly the cure temperature will depend on the specific acid or acid (thermal) generator that is employed in the coating composition. Typical cure conditions are from about 80° C. to 225° C. for about 0.5 to 40 minutes. Cure conditions preferably render the coating composition coating layer substantially insoluble to the photoresist solvent as well as an alkaline aqueous developer solution.

After such curing, a photoresist is applied above the surface of the applied coating composition. As with application of the bottom coating composition layer(s), the overcoated photoresist can be applied by any standard means such as by spinning, dipping, meniscus or roller coating. Following application, the photoresist coating layer is typically dried by heating to remove solvent preferably until the resist layer is tack free. Optimally, essentially no intermixing of the bottom composition layer and overcoated photoresist layer should occur.

The resist layer is then imaged with activating radiation through a mask in a conventional manner. The exposure energy is sufficient to effectively activate the photoactive component of the resist system to produce a patterned image in the resist coating layer. Typically, the exposure energy ranges from about 3 to 300 mJ/cm$^2$ and depending in part upon the exposure tool and the particular resist and resist processing that is employed. The exposed resist layer may be subjected to a post-exposure bake if desired to create or enhance solubility differences between exposed and unexposed regions of a coating layer. For example, negative acid-hardening photoresists typically require post-exposure heating to induce the acid-promoted crosslinking reaction, and many chemically amplified positive-acting resists require post-exposure heating to induce an acid-promoted deprotection reaction. Typically post-exposure bake conditions include temperatures of about 50° C. or greater, more specifically a temperature in the range of from about 50° C. to about 160° C.

The photoresist layer also may be exposed in an immersion lithography system, i.e. where the space between the exposure tool (particularly the projection lens) and the photoresist coated substrate is occupied by an immersion fluid, such as water or water mixed with one or more additives such as cesium sulfate which can provide a fluid of enhanced refractive index. Preferably the immersion fluid (e.g., water) has been treated to avoid bubbles, e.g. water can be degassed to avoid nanobubbles.

References herein to "immersion exposing" or other similar term indicates that exposure is conducted with such a fluid layer (e.g. water or water with additives) interposed between an exposure tool and the coated photoresist composition layer.

The exposed resist coating layer is then developed, preferably with an aqueous based developer such as an alkali exemplified by tetra butyl ammonium hydroxide, sodium hydroxide, potassium hydroxide, sodium carbonate, sodium bicarbonate, sodium silicate, sodium metasilicate, aqueous ammonia or the like. Alternatively, organic developers can be used. In general, development is in accordance with art recognized procedures. Following development, a final bake of an acid-hardening photoresist is often employed at temperatures of from about 100° C. to about 150° C. for several minutes to further cure the developed exposed coating layer areas.

The developed substrate may then be selectively processed on those substrate areas bared of photoresist, for example, chemically etching or plating substrate areas bared of photoresist in accordance with procedures well known in the art. Suitable etchants include a hydrofluoric acid etching solution and a plasma gas etch such as an oxygen plasma etch. A plasma gas etch removes the underlying coating layer.

A plasma etch conducted by the following protocol: a coated substrate (e.g., substrate coated with an underlying coating composition and resist in accordance with the invention) is placed in a plasma etch chamber (e.g., Mark II Oxide Etch Chamber) at 25 mT pressure, top power of 600 watts, 33 $CHF_3$ (Sccm), 7 $O_2$ (Sccm) and 80 Ar (Sccm).

As discussed above, in preferred systems, the plasma etchant can remove an underlying coating composition as disclosed herein a an enhanced rate relative to prior underlayer compositions.

As discussed above, underlying coating compositions can provide reduced defects in a processed substrate, particularly reduced deposition of organic residues in substrates areas that are intended to be bared of photoresist. Additionally, use of underlying coating compositions can reduce or minimize the occurrence of undesired pattern collapse of a photoresist relief image formed over the underlying layer.

The following non-limiting examples are illustrative of the invention.

EXAMPLES 1-4

Syntheses of Polymers Useful in Coating Compositions

Example 1

Polyester Synthesis

All reagents were initially charged into the reactor with little regard to the order of addition. Charge: dimethylterephthalate (22.3 g, 115 mmol), dimethyl 5-hydroxyisophthalate (18.1 g, 86 mmol), 1,3,5-tris(2-hydroxyethyl)isocyanurate (52.5 g, 201 mmol), 2-hydroxyisobutyric acid (17.9 g, 172 mmol), p-toulenesulfonic acid (2.1 g, 11 mmol), and anisole (80 g). The reaction setup consisted of a 250-mL, three-neck, round-bottom flask fitted with a mechanical stirrer, temperature control box, temperature probe, heating mantle, condenser, Dean-Stark trap, and nitrogen purge inlet (sweep). The mixture was heated first to substantial reflux (120-150 C), and then gradually to a peak temperature of 150 C within 30 minutes. The temperature was maintain until a total reaction time, which was marked from the point of substantial reflux, had reached 5.25 h. The heat source was then removed, and the mixture was allowed to cool. The cooled solution was then diluted with THF (355 g) and precipitated into IPA. The polymer was collected by filtration through a Buchner funnel, air-dried, and then dried in vacuo between 40-70° C. The polymer yield was 28%. The molecular weight was determined by GPC; Mw=2840 and Mn=2064.

Example 2

Synthesis of Resin Containing Acid-Cleavable Group

Charged into a 500-mL, three-neck, round-bottom flask, fitted with a mechanical stirrer, temperature control box, temperature probe, dropping funnel, condenser, and nitrogen inlet (blanket) was t-butylmethacrylate (11.90 g, 83 mmol), 2-hydroxyethylmethacrylate (19.85 g, 153 mmol), styrene (6.91 g, 66 mmol), methyl methacrylate (12.55 g, 126 mmol), and methyl 2-hydroxyisobutyrate (HBM) (200 g). To the dropping funnel was charge a solution of Vazo-67 (Dupont) (4 g) dissolved in HBM (16 g). The monomeric mixture was heated with agitation to 85° C., before addition of the initiator. The time of addition was noted, and the mixture was allowed to continue reacting at 85 C for 22 h. The reaction was then thermally quenched by removing the heat source and allowing the mixture to cool to room temperature. The polymer was allowed to remain in solution at 25% solids. The molecular weight was determined by GPC; Mw=11010, and Mn=4704.

Example 3

Synthesis of Resin Containing Ring-Opening Anhydride

Charged into a 500-mL, three-neck, round-bottom flask, fitted with a mechanical stirrer, temperature control box, temperature probe, dropping funnel, condenser, and nitrogen inlet (blanket) was n-butylmethacrylate (27.20 g, 192 mmol), 2-hydroxyethylmethacrylate (9.95 g, 77 mmol), itaconic anhydride (12.80 g, 114 mmol), and methyl 2-hydroxyisobutyrate (HBM) (280 g). To the dropping funnel was charge a solution of Vazo-67 (Dupont) (2 g) dissolved in HBM (16 g). The monomeric mixture was heated with agitation to 85 C, before addition of the initiator. The time of addition was noted, and the mixture was allowed to continue reacting at 85° C. for 22 h. The reaction was then thermally quenched by removing the heat source and allowing the mixture to cool to room temperature. The polymer was allowed to remain in solution at 15% solids. The molecular weight was determined by GPC; Mw=16258, and Mn=6444.

Example 4

Synthesis of High Oxygen Content Resin

By the general procedures of Example 1, dihydropyran (DHP), methyl acrylate (MA) and 2-hydroxyethyl methacrylate (HEMA) in a respective molar ratio of monomer charge to the reaction vessel of 35:25:20 to provide a DHP:MA:HEMA terpolymer.

Examples 5-13

Contact Angle Switches

Nine underlying coating compositions (referred to below as Coating Compositions 1 through 9) were prepared by admixing the components as set forth in the following Table 1:

ized monomers specify the molar charge of the monomers in the resin preparation. The glycouril resin is sold under the tradename Powderlink 1774 by Cytec Industries. In those Coating Compositions 1 through 9, the cross-linker resin is present at about 15 weight percent of the resin component and the acid source (thermal acid generator) is present at about 0.8 weight percent of total solids (all materials except solvent). The solvent is present in an amount of about 96 weight percent of the total coating composition weight.

Each of the Coating Compositions 1 through 9 is spin coating onto a silicon wafer substrate and baked at 175° C. to remove solvent and harden or crosslink the coating composition layers.

For Coating Compositions 1 through 7 (Examples 5 through 11), a 193 nm photoresist composition was spin-coated over the coating composition and regions of the photoresist composition were exposed to 193 nm radiation at varying energy doses. The exposed photoresist layers were then post-exposure baked at about 110° C. for 60 seconds and the baked photoresist layers were developed with aqueous alkaline developer. Following development, water contact angles of the underlying coating compositions were determined using a JDSA-100 Dynamic Contact Angle Goniometer (Kruss GmbH). Water contact angles of the underlying

TABLE 1

| Example No. | Coating Composition No. | Resin 1 | Resin 2 | Crosslinker | Acid source | Solvent |
|---|---|---|---|---|---|---|
| 5 | 1 | TBMA/HEMA/STY/MMA (10/25/15/30) | None | Glycouril resin | pTSAN.NH$_3$ | HBM |
| 6 | 2 | HEMA/CNAMA (50:50) | Polyester 1 | Glycouril resin | pTSA.NH$_3$ | HBM |
| 7 | 3 | HEMA/CNNMA (50:50) | Polyester 2 | Glycouril resin | pTSA.NH$_3$ | HBM |
| 8 | 4 | MAMA/HEMA (30:70) | Polyester 1 | Glycouril resin | pTSA.NH$_3$ | HBM |
| 9 | 5 | MAMA/HEMA (30:70) | Polyester 2 | Glycouril resin | pTSA.NH$_3$ | HBM |
| 10 | 6 | ECPMA/HEMA (30:70) | Polyester 1 | Glycouril resin | pTSA.NH$_3$ | HBM |
| 11 | 7 | ECPMA/HEMA (30:70) | Polyester 2 | Glycouril resin | pTSA.NH$_3$ | HBM |
| 12 | 8 | nBMA/HEMA/IA (50:20:30) | Polyester 1 | Glycouril resin | pTSA.NH$_3$ | HBM |
| 13 | 9 | nBMA/HEMA/IA (50:20:30) | Polyester 2 | Glycouril resin | pTSA.NH$_3$ | HBM |

In the above Table 1, the following abbreviations designate the following materials: TBMA: tert-butyl methacrylate; HEMA: 2-hydroxyethyl methacrylate; STY: styrene; MMA: methyl methacrylate; CNNMA: 5-cyano-2-norbornyl-methacrylate; MAMA: 2-methyl-2-adamantyl methacrylate; ECPMA: 1-ethyl-1-cyclopentyl methacrylate; n-BMA; n-butyl methacrylate; IA: itaconic anhydride; polyester 1: polyester resin containing phenyl groups; polyester 2: polyester resin containing both phenyl and naphthyl groups; pTSA.NH$_3$: ammonia salt of p-toluene sulfonic acid; HBM: methyl 2-hydroxyisobutyrate. In Table 1, the numerical values (e.g. (10/25/15/30)) following the designated polymer-coating composition layer also were tested in areas that were not contacted with exposed photoresist. Results are set forth in Table 2 below.

For Coating Compositions 8 and 9 (Examples 12 and 13), underlying coating compositions were treated with 0.26N aqueous alkaline photoresist developer solution. Water contact angles of the coating layer contacted and non contacted with photoresist developer were determined using a JDSA-100 Dynamic Contact Angle Goniometer (Kruss GmbH). Results for those Coating Compositions 8 and 9 also were set forth in Table 2 below.

TABLE 2

| Example No. | Coating Composition No. | H₂O contact angle at no exposure | H₂O contact angle after 17 mJ/cm² | H₂O contact angle after 27 mJ/cm² | H₂O contact angle after 37 mJ/cm² |
|---|---|---|---|---|---|
| 5 | 1 | 76 | 57 | 56 | 55 |
| 6 | 2 | 55 | 47 | 48 | 48 |
| 7 | 3 | 74 | 54 | 53 | 53 |
| 8 | 4 | 50 | 46 | 45 | 45 |
| 9 | 5 | 70 | 53 | 52 | 52 |
| 10 | 6 | 49 | 44 | 44 | 44 |
| 11 | 7 | 63 | 50 | 50 | 50 |
| 12 | 8 | 85 | 56 | 50 | 55 |
| 13 | 9 | 85 | 56 | 50 | 55 |

Examples 14-20

Preparation and Processing of Additional Underlying Coating Compositions

An additional nine underlying coating compositions (Coating Compositions of Examples 14 through 20 as referred to below) were prepared by admixing the components as set forth in the following Table 3:

TABLE 3

| Example No. | First resin | Additional acrylate resin | Additional polyester resin (s) | Crosslinker 1 | Crosslinker 2 | Acid source | Solvent |
|---|---|---|---|---|---|---|---|
| 14 | DHP:MA:HEMA (35:35:30) | | Polyester 1 | Glycouril resin | Melamine resin | pTSA.NH₃ | HBM |
| 15 | HEMA:CNNMA (70:30) | | Polyester 1 | Glycouril resin | Melamine resin | pTSA.NH₃ | HBM |
| 16 | HEMA:CNNMA (50:50) | HEMA:MMA (50:50) | Polyester 1 | Glycouril resin | Melamine resin | pTSA.NH₃ | HBM |
| 17 | HEMA:CNNMA (50:50) | DHP:MA:HEMA (30:35:35) | Polyester 1 | Glycouril resin | Melamine resin | pTSA.NH₃ | HBM |
| 18 | HEMA:CNNMA (50:50) | DHP:MA:HEMA (30:35:35) | Polyester 1 and Polyester 2 | Glycouril resin | Melamine resin | pTSA.NH₃ | HBM |
| 19 | HEMA:CNNMA (50:50) | | Polyester 1 and Polyester 3 | Glycouril resin | Melamine resin | pTSA.NH₃ | HBM |
| 20 | HEMA:CNNMA (50:50) | | Polyester 1 and Polyester 3 | Glycouril resin | Melamine resin | pTSA.NH₃ | HBM |

In the above Table 3, the following abbreviations designate the following materials: DHP: dihydropyran; MA: methyl acrylate; HEMA: 2-hydroxyethyl methacrylate; MMA: methyl methacrylate; CNNMA: 5-cyano-2-norbornyl-methacrylate; polyester 1: polyester resin containing phenyl groups; polyester 2: polyester resin containing both phenyl and naphthyl groups; polyester 3 is an additional polyester resin having phenyl groups and distinct from polyester resins 1 and 2; pTSA.NH₃: ammonia salt of p-toluene sulfonic acid; HBM: methyl 2-hydroxyisobutyrate. In Table 3, the numerical values (e.g. (30:35:35)) following the designated polymerized monomers specify the molar charge of the monomers in the resin preparation. The glycouril resin is sold under the tradename Powderlink 1774 by Cytec Industries. The melamine resin is Cymel 303 also commercially available from Cytec Industries. In the coating compositions, the crosslinker resin is present at about 15 weight percent of the resin component and the acid source (thermal acid generator) is present at about 0.8 weight percent of total solids (all materials except solvent). The solvent is present in an amount of about 96 weight percent of the total coating composition weight.

Each of the Coating Compositions of Examples 14 through 20 is spin coated onto a silicon wafer substrate and baked at 175° C. to remove solvent and harden or crosslink the coating composition layers.

For each of the Coating Compositions of Examples 14 through 20 a photoresist composition is spin-coated over the coating composition and regions of the photoresist composition are exposed to patterned activating radiation. The exposed photoresist layers are post-exposure baked at about 110° C. for 60 seconds and the baked photoresist layers were developed with aqueous alkaline developer. Following development, water contact angles of the underlying coating compositions are determined using a JDSA-100 Dynamic Contact Angle Goniometer (Kruss GmbH). Water contact angles of the underlying coating composition layer also were tested in areas that were not contacted with exposed photoresist. Results are set forth in Table 4 below.

TABLE 4

| Example No. | H₂O contact angle at no exposure | H₂O contact angle exposure |
|---|---|---|
| 14 | 71 | 55 |
| 15 | 69 | 52 |
| 16 | 66 | 51 |
| 17 | 67 | 51 |
| 18 | 62 | 50 |
| 19 | 63 | 52 |
| 20 | 52 | 49 |

Example 21

Coating Composition Preparation and Lithographic Processing

A coating composition was prepared by admixing the following materials:
Resin Component
p-hydroxystyrene/tert-butylacrylate copolymer
anthracenemethacrylate/2-hydroxyethylmethacrylate copolymer
Crosslinker Component
glycouril resin
melamine resin
Acid Source
p-toulene sulfonic acid triethylamine salt
Solvent
propylene glycol methyl ether
propylene glycol methyl ether acetate The two resins were present in about equal weight ratios. The crosslinker component was present in 11 weight percent of the resin component. The thermal acid generator compound was present in an amount of about 0.5 weight percent of total solids (all components expect solvent). The solvents were present in a weight ratio of 70:30 propylene glycol methyl ether: propylene glycol methyl ether acetate.

The formulated coating composition was spin coated onto a silicon microchip wafer and cured at 175° C. for 60 seconds on a vacuum hotplate to provide a dried, hardened coating layer thickness of 80 nm.

A commercially available 248 nm photoresist was then spin-coated over the cured coating composition layer. The applied resist layer was soft-baked at 100° C. for 60 seconds on a vacuum hotplate, exposed to patterned 248 nm radiation through a photomask, post-exposure baked at 110° C. for 60 seconds and then developed with 0.26 N aqueous alkaline developer to provide a resist relief image.

What is claimed is:

1. A method of forming a photoresist relief image, comprising:
    applying a coating composition on a substrate, the applied composition can be treated to provide a different water contact angle, wherein the coating composition layer comprises (i) a first component that comprises an oxygen containing material and (ii) a second component that is separate and distinct from the first component and comprises acid-labile groups or anhydride groups;
    applying a photoresist composition above the coating composition layer; and
    exposing and developing the photoresist layer to provide a resist relief image.

2. The method of claim 1 wherein the applied coating composition is treated with photoacid from the photoresist layer to provide a decreased water contact angle of the coating composition areas that contact the photoacid.

3. The method of claim 1 wherein the second component comprises acid-labile groups.

4. The method of claim 1 wherein the second component comprises anhydride groups.

5. The method of claim 1 wherein the first component comprises a resin that comprises polymerized acrylate ester units.

6. The method of claim 1 wherein the first component comprises a resin that comprises 3-methoxy-4-acetoxystyrene units, 4-nitrostyrene units, 3-nitrostyrene units or 4-nitrophenylmethacrylate units.

* * * * *